United States Patent
Byun et al.

(10) Patent No.: US 11,314,590 B2
(45) Date of Patent: Apr. 26, 2022

(54) MEMORY DEVICE FOR DETECTING A DEFECTIVE MEMORY CHIP

(71) Applicant: SAMSUNG ELECTRONICS CO., LTD., Suwon-si (KR)

(72) Inventors: Hui Chung Byun, Hwaseong-si (KR); Yoen Hwa Lee, Seoul (KR); Seung Hun Lee, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 46 days.

(21) Appl. No.: 16/934,788

(22) Filed: Jul. 21, 2020

(65) Prior Publication Data

US 2020/0349000 A1 Nov. 5, 2020

Related U.S. Application Data

(62) Division of application No. 16/122,146, filed on Sep. 5, 2018, now Pat. No. 10,754,724.

(30) Foreign Application Priority Data

Feb. 20, 2018 (KR) .................. 10-2018-0019706

(51) Int. Cl.
*G11C 29/00* (2006.01)
*G06F 11/10* (2006.01)
(Continued)

(52) U.S. Cl.
CPC ...... *G06F 11/1044* (2013.01); *G06F 11/1048* (2013.01); *G11C 7/10* (2013.01);
(Continued)

(58) Field of Classification Search
CPC ...... G06F 11/104; G06F 11/1048; G11C 7/10; G11C 29/4401; G11C 29/785; G11C 2029/4402
See application file for complete search history.

(56) References Cited

U.S. PATENT DOCUMENTS

| 6,934,203 B2* | 8/2005 | Choi | G11C 29/808 365/200 |
| 7,231,582 B2* | 6/2007 | Worley | H03M 13/095 714/773 |

(Continued)

FOREIGN PATENT DOCUMENTS

| KR | 101212748 B1 | 12/2012 |
| KR | 20170055222 A | 5/2017 |

(Continued)

OTHER PUBLICATIONS

"Notice of Allowance", KR Application No. 10-2018-0019706, dated Dec. 27, 2021, 2 pp.

*Primary Examiner* — Esaw T Abraham
(74) *Attorney, Agent, or Firm* — Myers Bigel, P.A.

(57) ABSTRACT

A memory device includes a plurality of memory chips storing and outputting data in response to a control command and an address command, at least one ECC memory chip providing an error check and correction (ECC) function on the data stored and output by the plurality of the memory chips, and a controller, marking a memory chip in which a defective memory cell is detected among the plurality of memory chips, as a defective memory chip, storing data of the defective memory chip in the ECC memory chip, and controlling the defective memory chip to execute a post package repair (PPR).

9 Claims, 14 Drawing Sheets

(51) Int. Cl.
*G11C 29/44* (2006.01)
*G11C 7/10* (2006.01)

(52) U.S. Cl.
CPC ........ *G11C 29/4401* (2013.01); *G11C 29/785* (2013.01); *G11C 2029/4402* (2013.01)

(56) References Cited

U.S. PATENT DOCUMENTS

| | | | |
|---|---|---|---|
| 7,248,514 B2 * | 7/2007 | Nishihara | G11C 29/44 |
| | | | 365/200 |
| 7,984,329 B2 | 7/2011 | Lastras-Montano et al. | |
| 8,200,887 B2 | 6/2012 | Bennett | |
| 8,395,943 B2 * | 3/2013 | Kang | G11C 16/20 |
| | | | 365/185.18 |
| 8,750,059 B2 | 6/2014 | O'Connell et al. | |
| 8,856,620 B2 | 10/2014 | Meaney et al. | |
| 9,081,713 B1 | 7/2015 | Bennett | |
| 9,202,595 B2 | 12/2015 | Wilson et al. | |
| 9,349,491 B1 * | 5/2016 | Morgan | G11C 29/78 |
| 9,418,762 B1 | 8/2016 | You | |
| 9,734,921 B2 | 8/2017 | Ware et al. | |
| 9,767,922 B2 | 9/2017 | Lee et al. | |
| 9,804,920 B2 | 10/2017 | Ping et al. | |
| 9,959,164 B2 * | 5/2018 | Park | G11C 29/4401 |
| 9,997,257 B1 * | 6/2018 | Lee | G11C 29/76 |
| 10,395,748 B2 | 8/2019 | Shibata et al. | |
| 10,395,750 B2 | 8/2019 | Berke et al. | |
| 10,490,246 B2 * | 11/2019 | Ku | G11C 17/16 |
| 2006/0126408 A1 * | 6/2006 | Bucksch | G11C 29/846 |
| | | | 365/200 |
| 2007/0226552 A1 * | 9/2007 | Kushiyama | G11C 29/24 |
| | | | 714/710 |
| 2015/0261632 A1 | 9/2015 | Kim et al. | |
| 2017/0185499 A1 | 6/2017 | Lee et al. | |
| 2017/0192843 A1 | 7/2017 | Warnes et al. | |
| 2017/0200511 A1 | 7/2017 | Warnes et al. | |

FOREIGN PATENT DOCUMENTS

| | | |
|---|---|---|
| KR | 20170076476 A | 7/2017 |
| WO | 2017030564 A1 | 2/2017 |

* cited by examiner

MEMORY DEVICE FOR DETECTING A DEFECTIVE MEMORY CHIP

CROSS-REFERENCE TO RELATED APPLICATIONS

This U.S. non-provisional patent application is a divisional of U.S. patent application Ser. No. 16/122,146, filed Sep. 5, 2018, now U.S. Pat. No. 10,754,724, issued Aug. 25, 2020, which itself claims priority under 35 U.S.C. § 119 to Korean Patent Application No. 10-2018-0019706, filed on Feb. 20, 2018 in the Korean Intellectual Property Office, the disclosures of which are incorporated herein by reference in their entireties.

BACKGROUND

The present inventive concept relates to a memory device.

A memory device includes a plurality of memory chips capable of storing and providing data as output and is applied to various fields such as a personal computer, a mobile electronic device, a server, a database, and the like.

Recently, as the amount of data of memory chips included in the memory device has increased, the degree of integration of memory cells has increased. Various techniques for dealing with defects and data errors that may occur in the memory cells have been developed.

SUMMARY

Some embodiments of the present inventive concept provide a memory device which may simultaneously execute an operation of processing a defective memory cell while an operation of storing and/or outputting data is being processed.

According to some embodiments of the present inventive concept, a memory device includes a plurality of memory chips configured to store and output data in response to a control signal and an address command, at least one error check and correction (ECC) memory chip configured to provide an ECC function on the data stored by the memory chips, and a controller configured to mark a memory chip in which a defective memory cell is detected among the plurality of memory chips, as a defective memory chip, configured to store the data of the defective memory chip in the ECC memory chip, and configured to control the defective memory chip to execute a post package repair (PRR).

A memory device according to some embodiments of the present inventive concept includes a plurality of memory chips, ones of the plurality of memory chips including a plurality of memory cells connected to a plurality of row lines and a plurality of column lines, and a plurality of redundancy memory cells connected to a plurality of redundancy lines, and an ECC memory chip configured to store at least one of parity data and CRC codes of data stored and/or output by the plurality of memory chips. Data stored in a defective memory chip including a defective memory cell among the plurality of memory chips is moved to the ECC memory chip, and an address of a defective row line connected the defective memory cell is replaced with an address of a first redundancy line among the plurality of redundancy lines.

A memory device according to some embodiments of the present inventive concept includes a plurality of memory chips, an ECC memory chip configured to store parity information associated with data stored by at least one of the plurality of memory chips, and a controller configured to copy data of a defective memory chip to the ECC memory chip, configured to transmit a transfer command and an address command from the defective memory chip to the ECC memory chip, and configured to provide a post package repair command to the defective memory chip, when a defective memory chip including a defective memory cell is detected among the plurality of memory chips.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items.

Hereinafter, example embodiments of the present inventive concept will be described with reference to the accompanying drawings.

Figure 1:
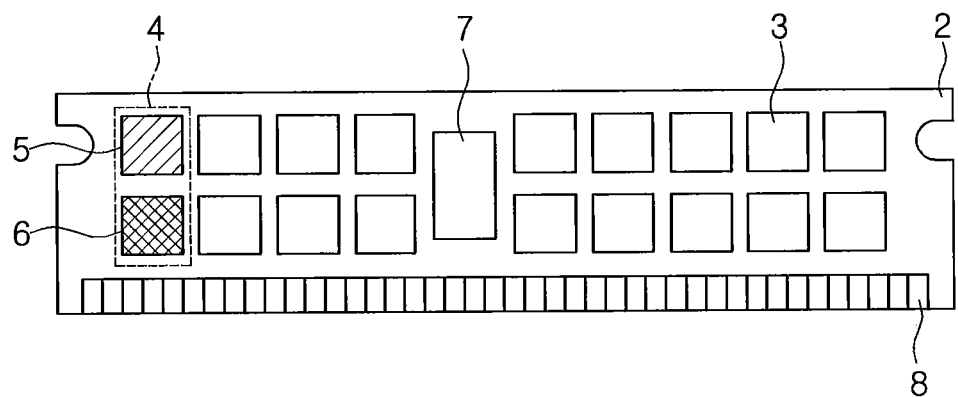
FIGS. 1 and 2 are diagrams of a memory device according to example embodiments of the present inventive concept.
Figure 2:
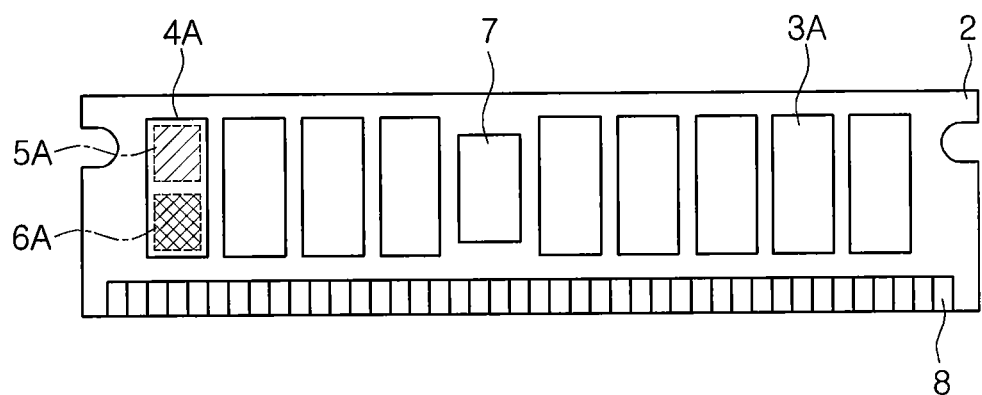

FIGS. 1 and 2 are drawings of a memory device according to example embodiments of the present inventive concept.

Referring to FIG. 1, a memory device 1, according to example embodiments of the present inventive concept, may include a plurality of memory chips 3 mounted on a substrate 2, an error check and correction (ECC) memory chip 4 providing an error check and correction (ECC) function on data stored and output by the plurality of memory chips, and the like. According to example embodiments, the memory device 1 may further include a controller 7 transmitting a control command, an address command and the like to the plurality of memory chips 3 and the ECC memory chip 4 and input/output pads 8 arranged on an edge of the substrate 2.

The input/output pads 8 may be connected to the data input/output (DQ) paths of the plurality of memory chips 3 and ECC memory chips 4 respectively. In example embodiments, the controller 7 may include a register clock driver (RCD).

The ECC memory chip 4 may provide a function of detecting or correcting an error in data in a plurality of memory chips 3, store and output data, and may include a parity memory chip 5 and a cyclic redundancy check (CRC) memory chip 6. The parity memory chip 5 may store parity information such as, for example, parity bits. The parity bits may be related to parity that is determined for data stored and/or output by the plurality of memory chips 3. Meanwhile, the CRC memory chip 6 may store a cyclic redundancy check (CRC) code of data stored and/or output by the plurality of memory chips 3.

In example embodiments illustrated in FIG. 1, a memory device 1 is shown to include 16 memory chips 3. However, the number of memory chips 3 may change the data storage capacity that the memory chip 1 provides and/or may change respective data storage capacities of the memory chips 3. On the other hand, the configuration of the ECC memory chip 4 may change depending on the number of the memory chips 3 included in the memory device 1 and/or the capacity of each of the memory chips 3.

In example embodiments illustrated in FIG. 2, the memory device 1A may include 8 memory chips 3A, and an ECC memory chip 4A. When the memory devices 1 and 1A illustrated in FIGS. 1 and 2 have the same capacity, respective capacities of the memory chips 3A illustrated in FIG. 2 may be twice as respective capacities of the memory chips 3A illustrated in FIG. 1. Also, in example embodiments, the number of data input/output paths connected to each of the memory chips 3A illustrated in FIG. 2 may be also twice as the number of data input/output paths connected to each of the memory chips 3A illustrated in FIG. 1 due to the increased number of memory chips.

In example embodiments illustrated in FIG. 2, an ECC memory chip 4A may include a plurality of memory area 5A and 6A. As an example, a memory area 5A may perform the same function or a similar function as a parity memory chip 5, according to example embodiments illustrated in FIG. 1. The memory area 6A may perform the same function or similar functions as a CRC memory chip 6 according to example embodiments illustrated in FIG. 2. Each of the memory areas 5A and 6A may store and/or output data through different data input/output paths.

Figure 3:
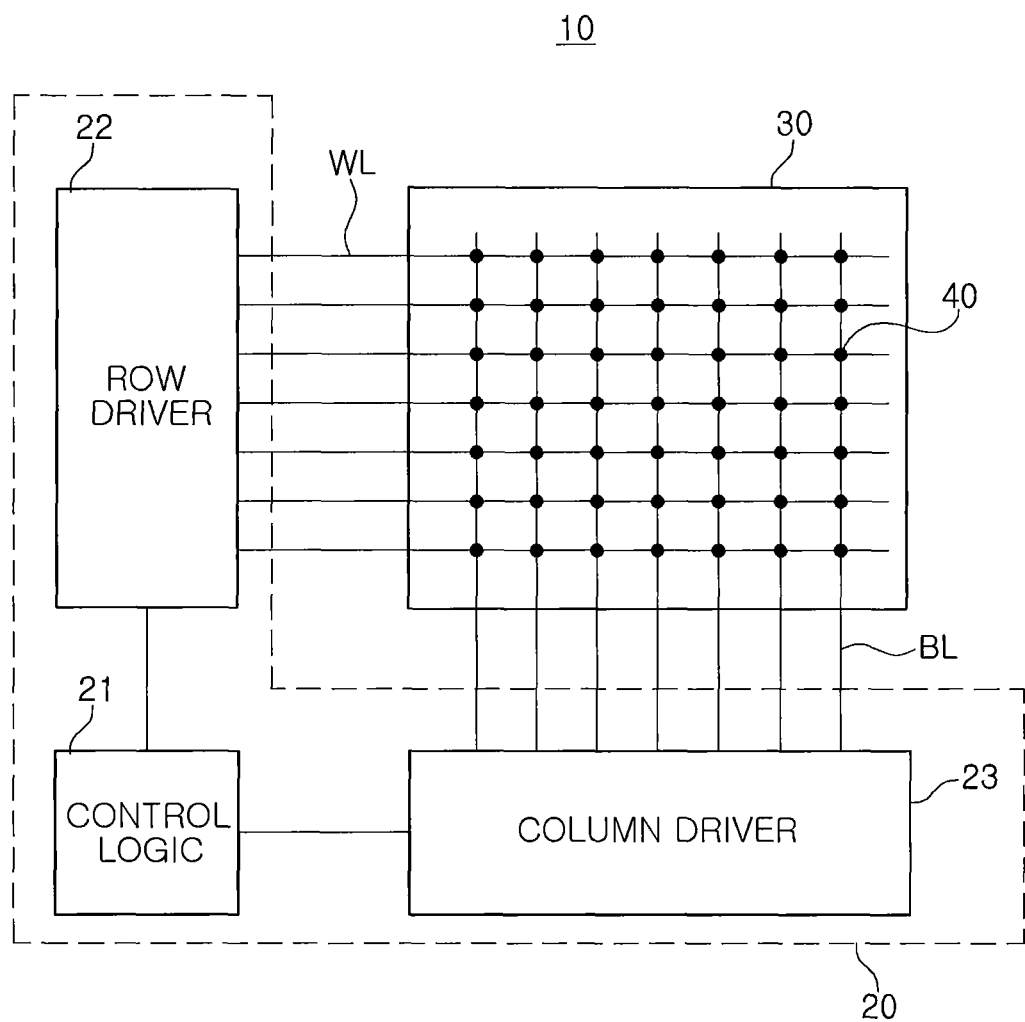
FIG. 3 is a schematic block diagram of a memory chip according to example embodiments of the present inventive concept.

FIG. 3 is a schematic block diagram of a memory chip according to example embodiments of the present inventive concept.

FIG. 3 may be a schematic block diagram of an internal structure of a memory chip 10 included in a memory device according to example embodiments of the present inventive concept. The memory chip 10 according to example embodiments of the present inventive concept may be selected as a plurality of memory chips 3 and/or 3A included in the memory devices 1 and/or 1A illustrated in FIGS. 1 and 2. Referring to FIG. 3, the memory chip 10, according to example embodiments of the present inventive concept, may include a controller 20 and a bank array 30. In example embodiments, the controller 20 may include control logic 21, a row driver 22 and a column driver 23, and the bank array 30 may include the plurality of the memory cells 40.

In example embodiments, the row driver 22 may be connected to the memory cells 40 through one or more word lines WL, and the column driver 23 may be connected to the memory cells 40 through one or more bit line BL. In example embodiments, the row driver 22 may write data or select memory cell MC from which the data is to be read and the column driver 23 may write data to the memory cell MC or include a reading/writing circuit reading data from the memory cell MC. The operation of the row driver 22 and the column driver 23 may be controlled by the control logic 21.

Figure 4:
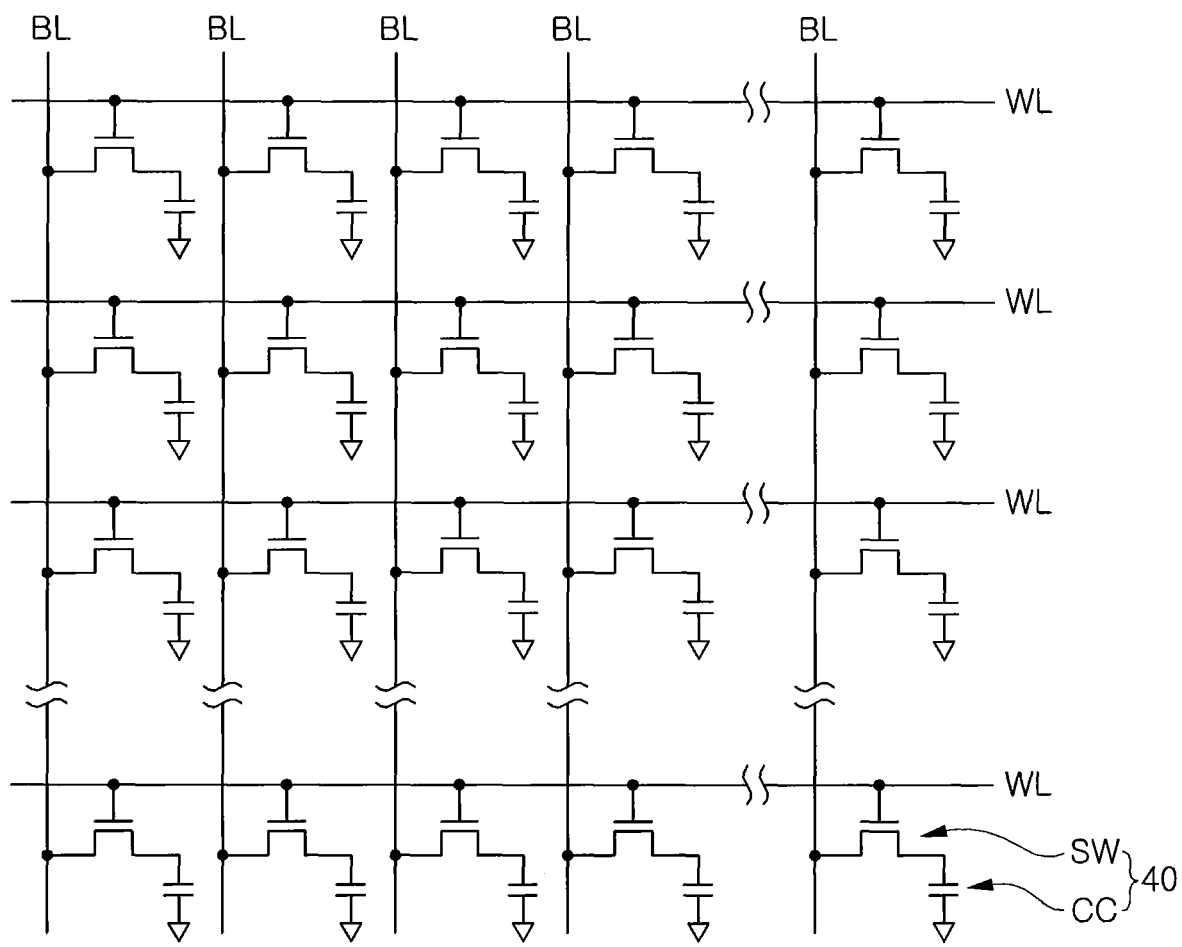
FIG. 4 is a diagram of a bank array included in the memory chip according to example embodiments of the present inventive concept.

FIG. 4 is a diagram of a bank array included in the memory chip according to example embodiments of the present inventive concept.

Referring to FIG. 4, a bank array 30, according to example embodiments of the present inventive concept, may include a plurality of memory cells 40. The memory cells 40 may be provided at one or more points at which word lines WL and bit lines BL intersect. For example, each of the memory cells 40 may be connected to one word line WL and one bit line BL.

Each of the memory cells 40 may include a switching element SW and an information storage capacitor CC. In one example embodiment, the switching element SW may include a transistor and a gate terminal. The gate terminal of the transistor may be connected to the word line WL, and/or the drain and source terminals of the transistor may be connected to the bit line BL and the information storage capacitor CC respectively.

The controller included in the memory chip may write or erase data by storing charge in the information storage capacitor CC included in each of the plurality of the memory cells 40 using the word lines WL and bit lines BL for addressing. The charge stored in the information storage capacitor CC may be discharged when data is no longer needed to be stored. Further, the controller may read data from each of the plurality of the memory cells by reading the voltage of the information storage capacitor CC. In example embodiments, the controller may perform a refresh operation for rewriting data to the plurality of the memory cells 40 so that the charge stored in the information storage capacitor CC that has been naturally discharged is refreshed such that no data is lost.

Figure 5:
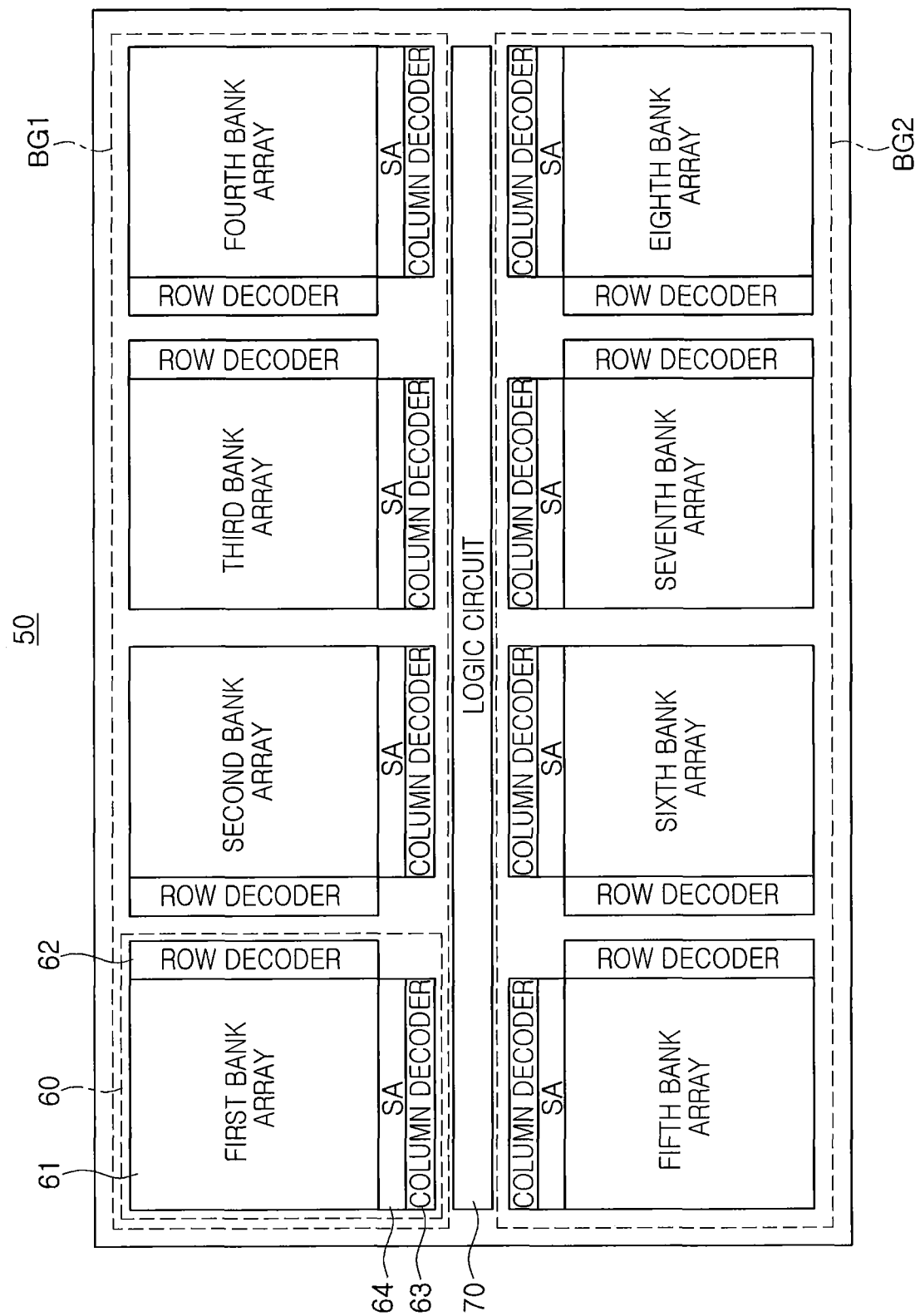
FIG. 5 is a schematic diagram of a structure of the memory chip included in the memory device according to example embodiments of the present inventive concept.

FIG. 5 is a schematic diagram of a structure of a memory chip included in the memory device according to example embodiments of the present inventive concept.

Referring to FIG. 5, the memory chip 50 according to example embodiments of the present inventive concept may include a plurality of memory banks 60 and a logic circuit 70. Each of the plurality of memory banks 60 may include a bank array 61, such as bank array 30 of FIG. 4, having a plurality of memory cells, a row decoder 62, a column decoder 63 and a sense amplifier 64. In example embodiments, some of the plurality of the memory banks 40 may be grouped. In example embodiments illustrated in FIG. 5, the first to fourth memory banks may be included in the first bank group BG1, and the fifth to eighth memory banks may be included in the second bank group BG2. It will be understood that, although the terms first, second, third, etc.

may be used herein to describe various elements, elements should not be limited by these terms; rather, these terms are only used to distinguish one element from another element. Thus, a first element discussed below could be termed a second element without departing from the scope of the present inventive concepts. The plurality of memory banks 60 included in the memory chip 50 may share a logic circuit 70. The logic circuit 70 may read data from the bank array 61, designate an address for storing data in the bank array 61, and/or determine an operation mode of the memory chip 50. The logic circuit 70 may include input/output pads for transmitting data to be stored in the plurality of memory banks 60 and data output from the plurality of memory banks 60.

In example embodiments, each of the plurality of memory banks 60 may include a plurality of memory cells for executing general operations such as storing and/or to output data. The memory banks 60 may include a plurality of redundancy memory cells. The redundancy memory cells may be memory cells provided for replacing defective memory cells occurring in portions of the plurality of memory cells. In other words, individual defective memory cells of groups of memory cells may be replaced by the redundancy memory cell upon detection of defects by the logic circuit.

For example, when defective memory cells occur, the logic circuit may perform a repair operation on the defective memory cells in accordance with a command input to the memory chip 50. As one non-limiting example, the repair operation may be a Post Package Repair (PPR) operation, and the repair operation may replace the memory cell with the redundancy memory cell. At this time, a row line or a column line connected to the defective memory cell may be replaced with a redundancy row line or a redundancy column line connected to at least a part of the one or more of the redundancy memory cells.

The repair operation may take a relatively long time. Therefore, when performing the repair operation on the defective memory cells after the operating system OS of the system on which the memory chip 50 is mounted booted, the whole system may have to be stopped for the time required for the repair operation. Example embodiments of the present inventive concept propose a memory device and a memory device capable of executing a repair operation on the defective memory cells without stopping system operations even after the operating system of the system is booted. Repairing and/or replacing defective memory cells without pausing or stopping the system may be advantageous to improve the availability and/or performance of the system.

Figure 6:
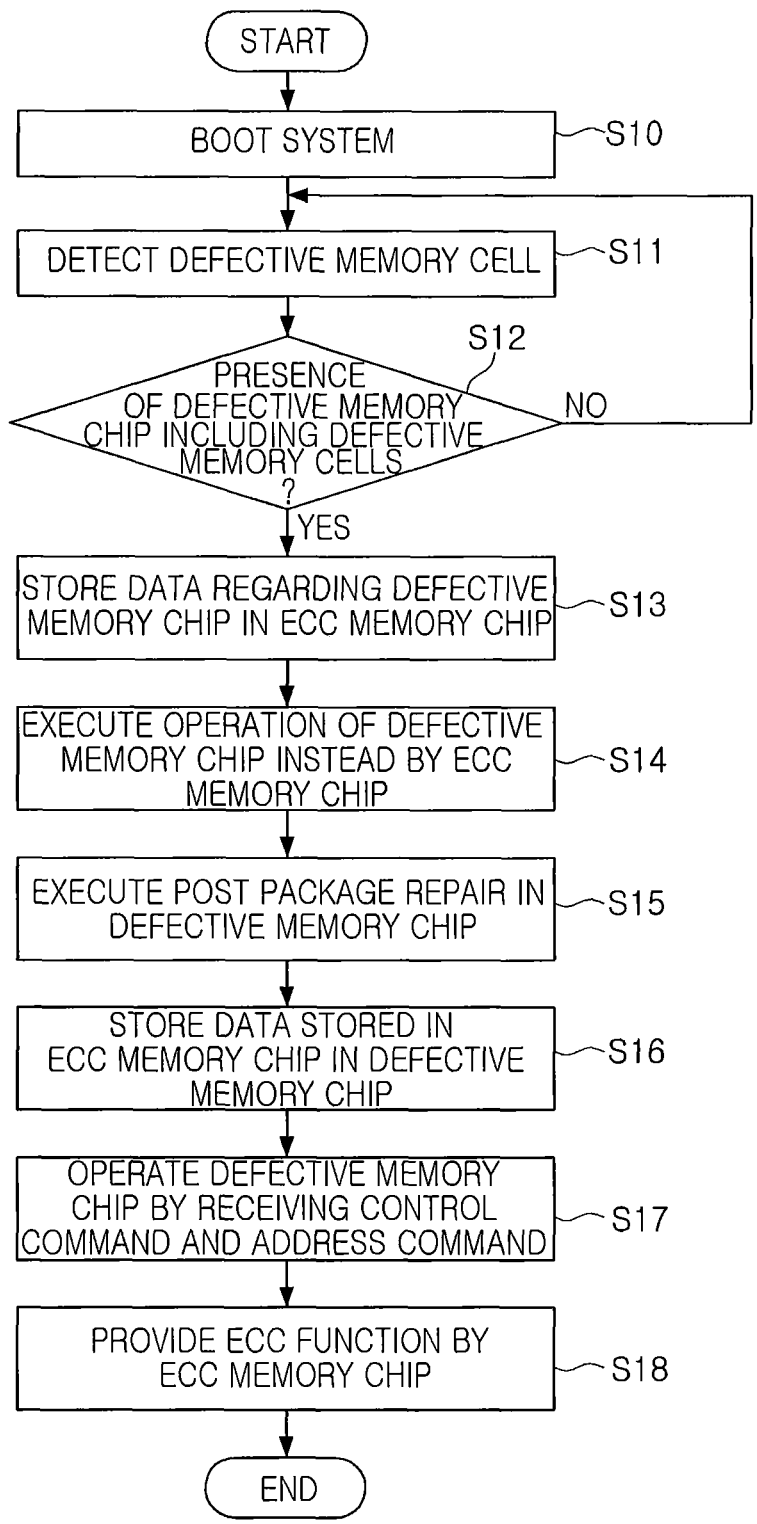
FIG. 6 is a flow chart provided to illustrate operations of the memory device according to example embodiments of the present inventive concept.

FIG. 6 is a flow chart provided to illustrate operations of a memory device according to example embodiments of the present inventive concept.

Referring to FIG. 6, the operation of the memory device according to example embodiments of the present inventive concept may be started by booting the system on which the memory device is mounted in S10. In example embodiments, the system may include a server, a database, a mobile electronic device, and/or a computer on which a memory device is mounted. The operating system (OS) installed in the system may be executed by system booting at S10.

When the system is booted, the defective memory cells may be detected by the memory device in S11. The memory cell may include a plurality of memory chips. They system of logic circuits of the memory device and may detect defective memory cells in one or more of the plurality of memory chips. In example embodiments, the defective memory cell may be directly detected by the controller included in the memory device or by the system on which the memory device is mounted.

For example, when a defective memory chip having a defective memory cell among a plurality of memory chips included in the memory device in S12 is determined to be present, the memory device may store data of the defective memory chip in an ECC memory chip in S13 in response to a command forwarded from the controller or the system. The ECC memory chip may be a memory chip provided to separate a die from a plurality of memory chips. As one example, the ECC memory chip may store parity bits and/or cyclic redundancy check CRC codes of the data. The parity bits and the CRC codes may be stored separately in physically separated chips or logically separated storage areas.

The data of the defective memory chip having a defective memory cell is transferred to an ECC memory chip, and the operation of the defective memory chip is replaced by the ECC memory chip in S14. For example, the memory device may maintain normal operations by excluding the defective memory chip from operations, while replacing the operation of the defective memory chip with the ECC memory chip. This replacement of the operation by the ECC memory chip occurs during operation, when the memory location is not being accessed. Thus, the ECC memory chip may be "hot-swapped" during normal operation of the system without interrupting, pausing, or stopping the system.

The memory device may execute the post package repair in the defective memory chip in response to the command of the controller of the memory device or the system. The memory device may be mounted while the ECC memory chip replaces the operation of the defective memory chip in S15. As described above, the post package repair may be an operation for repairing a defective memory cell existing in a defective memory chip. For example, by the post package repair operation, either the row line or the column line to which the defective memory cell is connected may be replaced by any one of a plurality of redundancy lines included in the defective memory chip.

When the post package repair is completed, the data stored in the ECC memory chip may be transferred to the defective memory chip in S16. The defective marking of the defective memory chip may be released such that the defective memory chip may receive and perform the control command and/or the address command in S17. In addition, the ECC memory chip may provide an ECC function on data that the plurality of memory chips store and/or output in S18.

The memory device according to example embodiments of the present inventive concept may replace the defective memory chip with the ECC memory chip by transferring and storing data on the defective memory chip in which the defective memory cell is detected from among the plurality of memory chips by the ECC memory chip. Therefore, even when a defective memory cell occurs, normal operations of the memory device may be maintained without data loss.

In addition, while the ECC memory chip replaces the operation of the defective memory chip, the problem of defective memory cells occurring in the defective memory chip may be solved by performing the post package repair in the defective memory chip. Thereafter, the data stored in the ECC memory chip may be transferred to and stored in the defective memory chip in which the post package repair is completed, and the ECC function of the ECC memory chip may be restored while controlling the defective memory to perform normal operations again. Therefore, the defective memory cell in the memory device may be recovered without degrading the memory capacity or loss of the ECC function, and the defective memory cell may be recovered without system interruption while the system is booted and operating.

FIGS. 7A, 7B, 7C and 7D are diagrams provided to illustrate the operation of the memory device according to example embodiments of the present inventive concept.

In example embodiments illustrated in FIGS. 7A to 7D, the memory device 100 may include a plurality of memory chips 120 mounted on a substrate 110 and an ECC memory chip 130. The ECC memory chip 130 may include a parity memory chip 131 and a CRC memory chip 132. The parity memory chip 131 may store parity bits of the data stored and/or output by the memory device 100, and the CRC memory chip 132 may store CRC codes of the data.

Input/output pads 150 for transmitting data may be provided on one side of the substrate 110. In addition, the memory device 100 may include a controller 140 for controlling operations of the plurality of memory chips 120 and the ECC memory chip 130. The controller 140 may generate a control command/or and an address command. In some embodiments, the controller 140 may receive a control command and/or an address command from an external host and transmit a suitable control command and/or the address command to one or more of the memory chips 120 and the ECC memory chip 130. In one example, the controller 140 may include a register clock driver (RCD) used for synchronizing command and/or data transfer between the controller and the various memory chips.

Figure 7A:
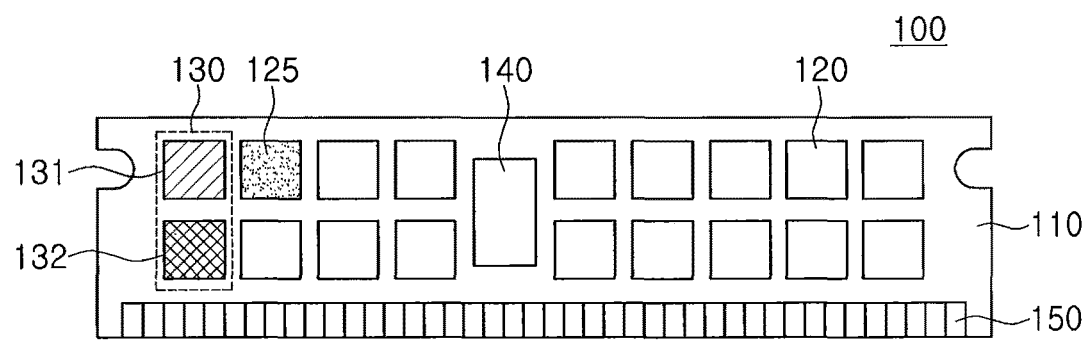
FIGS. 7A, 7B, 7C and 7D are diagrams provided to illustrate operations of the memory device according to example embodiments of the present inventive concept.
Figure 7B:
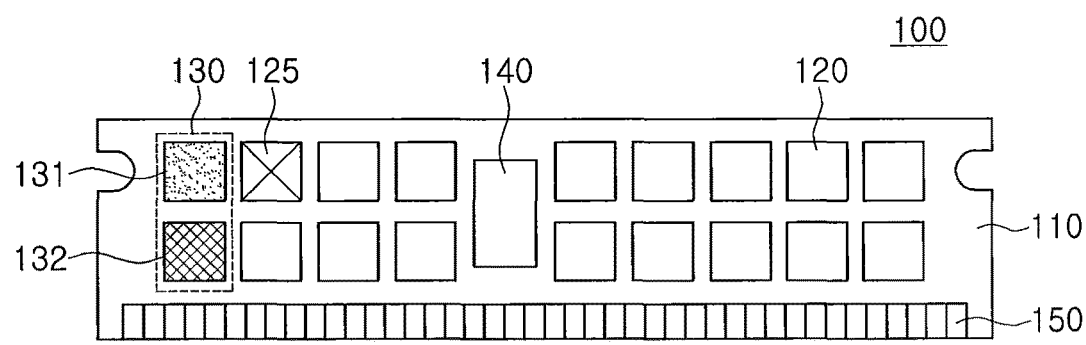

Referring to FIG. 7A, a defective memory chip 125, in which a defective memory cell occurs, among a plurality of memory chips 120, may be detected. The defective memory chip 125 may include a plurality of bank arrays, and each of the plurality of bank arrays may include the plurality of memory cells. A bank array may have one or more defective memory cells in the defective memory chip 125 When the defective memory cell is detected, the memory device 100 may transfer the data stored in the defective memory chip 125 to the parity memory chip 131 and store the data from the defective memory chip as illustrated in FIG. 7B. In this case, all data stored in the bank arrays in which the defective memory cells are not detected may be transferred to the parity memory chip 131. The parity memory chip 131 may be a part of the ECC memory chip 130. For example, all the data stored in the defective memory chip 125 may be stored in the parity memory chip 131, and the defective memory chip 125 may be marked as defective.

While the defective memory chip 125 is marked as defective, the operation of the defective memory chip 125 may be taken over by the parity memory chip 131. For example, in response to the data storage and/or an output command intended for the defective memory chip 125, the parity memory chip 131 may store or output data instead.

The memory device 100 may execute a post package repair in the defective memory chip 125 in response to a command from an external host or the controller 140. The post package repair may include operations for replacing the target memory cells shared by any one of the defective memory cells. The post package repair may include replacing a row line and a column line associated with a plurality of redundancy memory cells included in the defective memory chip 125.

Figure 7C:
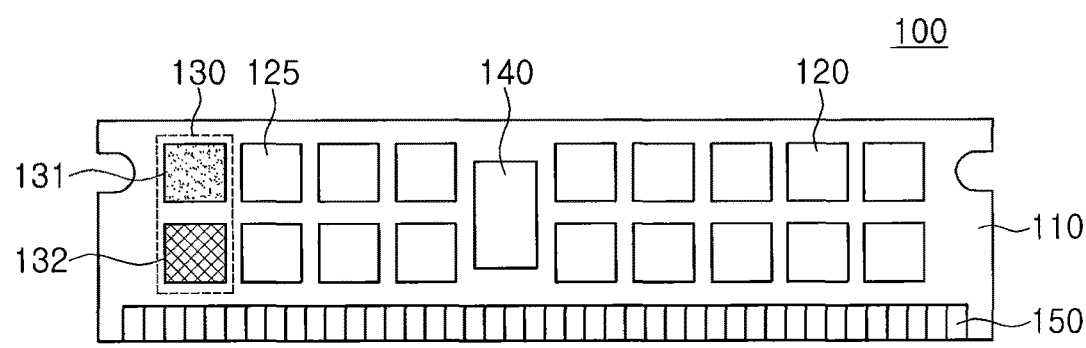

In example embodiments, the post package repair may be performed by mapping the address of the row line and/or the column line connected to the defective memory cell to one of a plurality of redundancy lines connected to the plurality of redundancy memory cells. Thus, in response to a data storage and/or output command intended for a defective memory cell, the redundancy memory cell may store and/or output the data. When the post package repair is completed, the memory device may remove the defective marking on the defective memory chip 125 as illustrated in FIG. 7C.

Figure 7D:
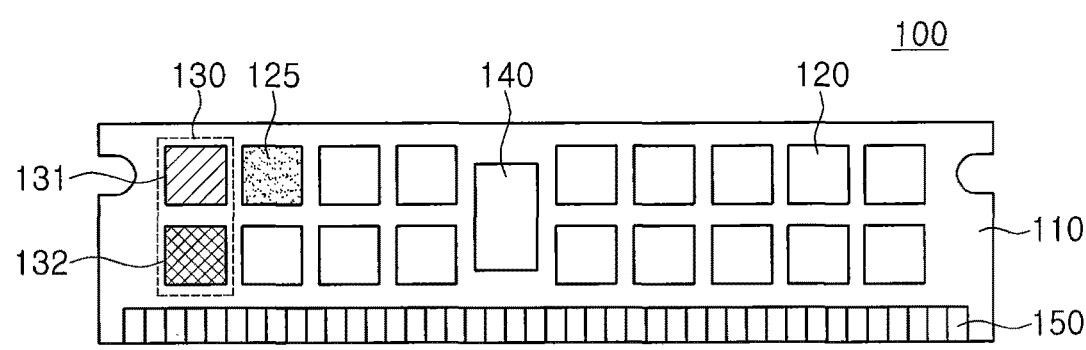

Referring to FIG. 7D, after removing the defective marking on the defective memory chip 125, the memory device 100 may transfer and/or store the data stored in the parity memory chip 131 to the defective memory chip 125. In addition, the memory device 100 may set the parity memory chip 131 to perform a function of storing parity bits again.

According to example embodiments in FIGS. 7A to 7D, for a defective memory chip 125 in which a defective memory cell is detected among the plurality of memory chips 120, data may be transferred to a parity memory chip 131. The parity memory chip 131 may be configured to perform the operations of the defective memory chip 125. In addition, while the parity memory chip 131 performs the operations of the defective memory chip 125, the defective memory chip may be replaced with a redundancy memory cell by executing the post package repair in the defective memory chip 125. When the post package repair is completed, the data stored in the parity may be stored in the defective memory chip 125 and the parity memory chip 131 may be set to provide the ECC function.

Therefore, even while the system on which the memory device 100 is mounted is booted and operated, a post package repair for restoring a defective memory cell may be executed in the memory device 100 without system interruption. Further, after the post package repair is completed, the ECC memory chip 130 may provide the ECC function again, so that the defect rate of the memory device 100 may be lowered and the operating performance and the stability may be greatly improved.

Figure 8:
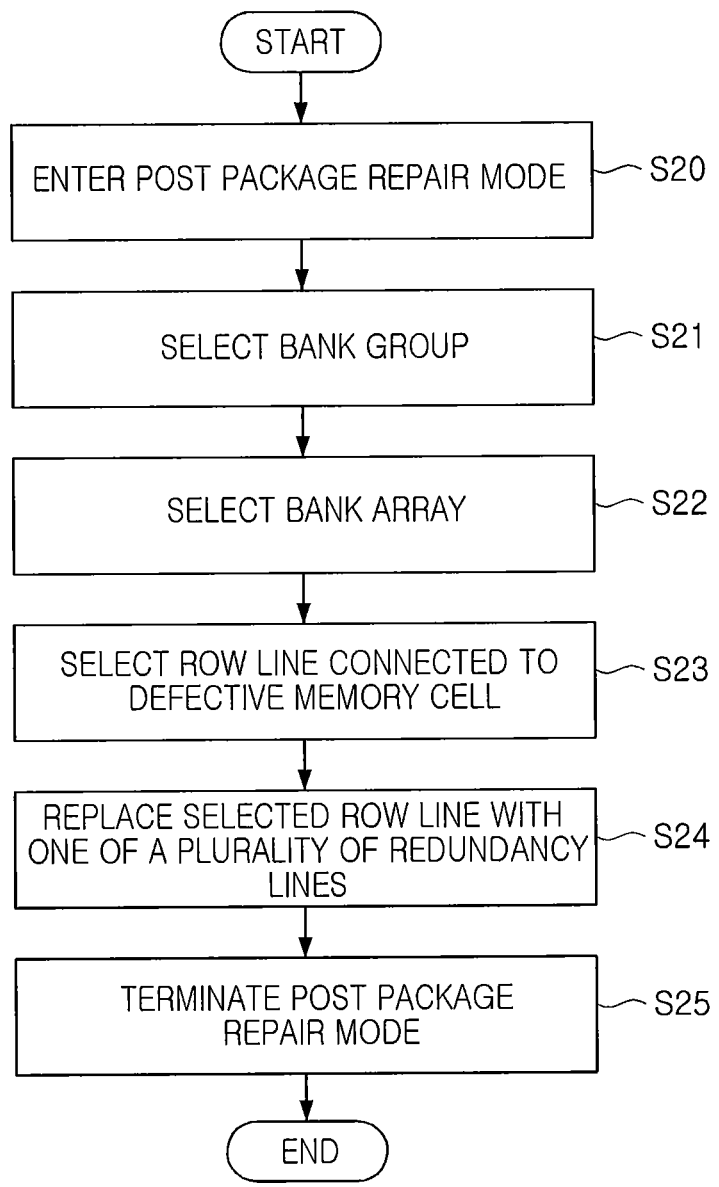
FIG. 8 is a flow chart provided to illustrate the post package repair operation executed in the memory chip included in the memory device according to example embodiments of the present inventive concept.

FIG. 8 is a flow chart provided to illustrate the operation of the post package repair executed in the memory device included in the memory device according to example embodiments of the present inventive concept.

Referring to FIG. 8, the operation of a post package repair according to example embodiments of the present inventive concept may start with a memory chip having a defective memory cell entering the post package repair mode S20. As an example, a defective memory chip having a defective memory cell may receive a control command entering a post package repair mode from a controller mounted on the memory device. The controller may directly generate a control command entering the post package repair mode or may receive the control command from a system on which the memory device is mounted.

The defective memory chip that has entered the post package repair mode may select a bank group having a defective memory cell, a bank array having defective memory cells, and/or a row line connected to a defective memory cell by receiving an address command from the controller in S21-S23. The defective memory chip may include a plurality of bank arrays, and the bank arrays may be classified into two or more groups. The defective memory chip may specify an address of a bank group and a bank array in which a defective memory cell is present and a row line in a defective memory cell, based on the address command input from the controller. In one example embodiment, in S23, the defective memory chip may select a column line other than the row line connected to the defective memory cell.

The defective memory chip may replace the row line connected to the defective memory cell with one of a plurality of redundancy lines in S24. In S24, the defective memory chip may map the row address indicating the row line connected to the defective memory cell to one of the plurality of redundancy lines. Therefore, when, the memory device receives an address command indicating a defective memory cell, a redundancy memory cell that is not actually a defective memory cell may be selected by the address command. Thereafter, the defective memory chip may receive a control command for exiting the post-package repair mode from the controller, and the post-package repair mode may be stopped or terminated in response to the control command in S25.

Figure 9:
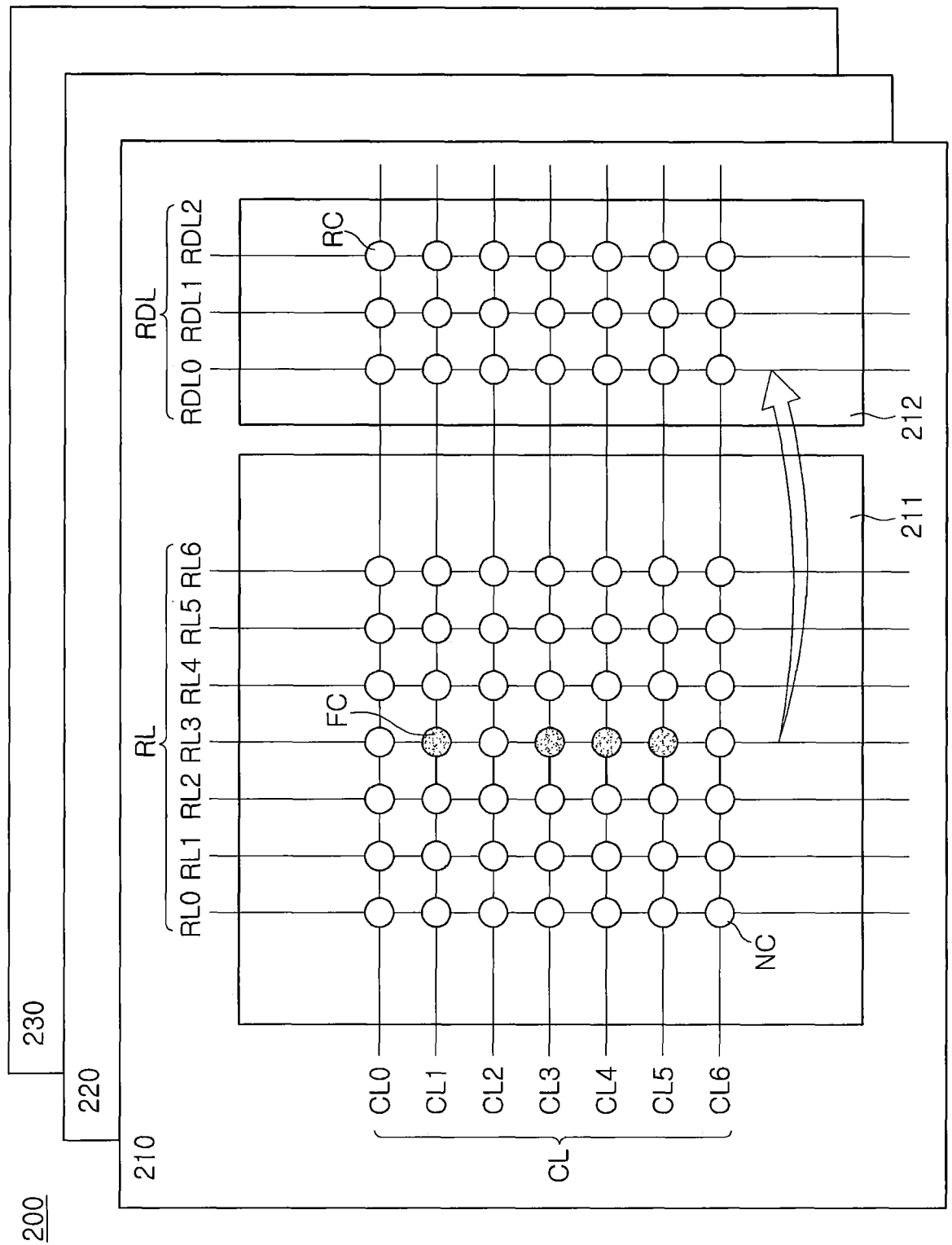
FIGS. 9 and 10 are drawings provided to illustrate a post package repair operation executed in the memory chip included in the memory device according to example embodiments of the present inventive concept.
Figure 10:
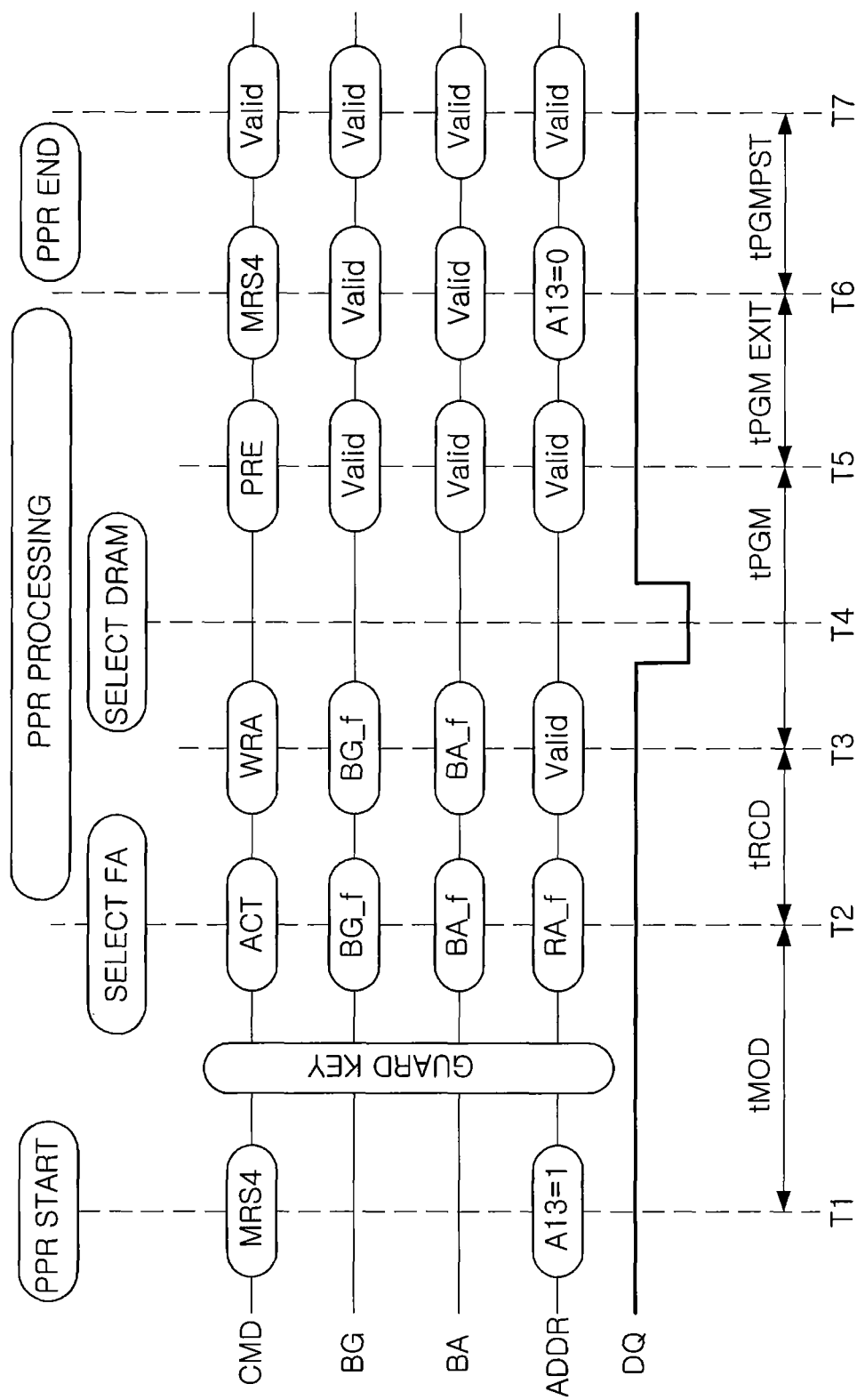

FIGS. 9 and 10 are drawings provided to illustrate operations of a post package repair executed in the memory chip included in the memory device according to example embodiments of the present inventive concept.

Referring to FIG. 9, the memory chip 200 may include a plurality of bank arrays 210-230. For example, the first bank array 210 includes a memory area 211 including a plurality of memory cells NC, and a memory cell array 211 for recovering the defective memory cells FC when a defective memory cell FC is generated among the plurality of memory cells NC And a redundancy area 212 provided for the purpose. The redundancy area 212 may include a plurality of redundancy memory cells RC. The other bank arrays 220 and 230 may have a structure similar to that of the first bank array 210. The post package repair operation of the memory chip 200 will now be described with reference to the first bank array 210 and the description may be similarly applied to the second bank array 220 and the third bank array 230.

For example, when a defective memory cell is detected in a memory, the memory chip 200 may output data stored in the bank arrays 210-230. The data stored in the bank arrays 210-230 may be stored in an ECC memory chip included in the memory device. When data output is finished, the memory chip 200 may execute a post package repair operation.

The memory chip 200 is connected to the defective memory cell FC based on the bank address indicating the first bank array 210 having the defective memory cell FC and the row address RL3 indicating the row line RL3 connected to the defective memory cell FC, FC position may be specified. When the position of the defective memory cell FC is specified, the memory device may map the address of the row line RL3 connected to the defective memory cell FC to one of the redundancy lines RDL.

For example, in some example embodiments illustrated in FIG. 9, the fourth row line RL3 connected to the defective memory cell FC may be mapped to the first redundancy line RDL0. Therefore, when the memory chip 200 in which the post package repair operation is completed receives an address command indicating the defective memory cell FC, the redundancy memory cell RC connected to the first redundancy line RDL0 instead of the defective memory cell FC may be selected.

The post package repair operation described with reference to FIG. 9 may be executed by a control command and an address command transmitted from the controller of the memory device including the memory chip 200. The control command and the address command may be directly generated from the controller of the memory device according to example embodiments or received from the host on which the memory device is mounted and transmitted to the memory chip 200.

FIG. 10 may be a timing diagram provided to illustrate a post-package repair operation performed in a memory chip according to example embodiments of the present inventive concept. Referring to FIG. 10, an address signal, for example, an A13 address signal, for entry into the post package repair mode together with the mode register command MRS4 at the first point in time T1 may be input to the memory chip. In example embodiments, as the A13 address signal is input to the high logic value '1', the memory chip may enter the post package repair mode.

At the second point in time T2 at which tMOD time has elapsed from the first point in time T1, the memory chip may receive an input from the bank group address BG_f, the bank array address BA_f indicating the position of the defective memory cell together with the active command ACT. Meanwhile, during the tMOD time between the first point in time T1 and the second point in time T2, the memory chip may perform a GUARD KEY operation to determine whether or not the entry into the post package repair mode is authentic. In example embodiments, the tMOD time may be set to the minimum amount of time required between a mode register set command and a command other than a mode register set command, in the standard of the memory chip.

A bank group address BG_f, a bank array address BA_f, and a row address RA_f received by the memory chip at the second point in time T2 may define failure addresses FAs for specifying the locations of the defective memory cell. When a third point in time T3 has arrived, when a faulty address being defined and a RAS to CAS Delay time tRCD has elapsed, the memory chip may receive input from the bank group address BG_f, the bank array address BA_f together with a write command WRA, and/or an effective address Valid.

At the fourth point in time T4, the memory chip may determine whether the logical value of the data input/output (DQ) path is a low logical value. The low logical value may represent the active state for data input/output (DQ) path. When the data input/output (DQ) path has a low logic value, the memory chip may be determined to be a target to execute the post package repair. When the data input/output (DQ) path has a high logic value, the memory chip may be determined to not be the target to execute the post package repair. In example embodiments, the time between the third point in time T3 and the fourth point in time T4 may be a time corresponding to a write latency WL.

As illustrated in FIG. 10, at the fourth point in time T4, when the memory chip confirms that the memory chip is the target to execute the post package repair, the memory chip may store the faulty address FA together with the active command ACT, which occurred at the second point in time T2. The faulty address FA may be stored separately in the storage element in the memory chip. The tPGM time may be a program time required for the faulty address FA to be stored in the storage element.

At the fifth point in time T5 when the storage of the faulty address FA is completed, the memory chip may receive the pre-charge command PRE, and in response thereto, the active state may be removed. At the sixth point in time T6, the memory chip may receive the A13 address signal for terminating the post-package repair mode together with the mode register set command MRS4. The A13 address signal input at the sixth point in time T6 may have a low logical value of '0.' On the other hand, the time tPGM EXIT between the fifth point in time T5 and the sixth point in time T6 may correspond to the minimum time required to terminate the post-package repair mode.

When the seventh point in time T7 comes after the time tPGMPST required for setting a new address from the sixth point in time T6 has elapsed, the memory chip may operate by receiving a valid control command and an address command from the controller. After the sixth point in time T6 when the post package repair operation is completed, the row indicated by the faulty address FA may be replaced with any of the redundancy lines included in the memory chip. For example, when a reading and/or writing command for a faulty address FA is input, a reading and/or writing command for a redundancy memory cell connected to a redundancy line may be provided to indicate replacing the row indicated by the faulty address FA. At this time, in order to solve the problem that may be caused by having unknown data in the redundancy memory cells, a writing operation such as a row copy operation may be performed on the redundancy memory cell connected to the redundancy line to be replaced.

In example embodiments described with reference to FIG. 10, the time tPGM required for the faulty address FA to be stored in the memory chip may be on the order of several hundreds of ms or several seconds. Such time tPGM may cause a violation of the timeout specification specified by the operating system of the system operating in conjunction with the memory device, so that the system may be interrupted by the post package repair operation.

In example embodiments of the present inventive concept, the above problem may be solved by setting the function of the memory chip in which the defective memory cell is found to be performed by the ECC memory chip before starting the post package repair operation. In detail, the ECC memory chip may receive and store data stored in the memory device in which the defective memory cell is found. In this case, the ECC memory chip may perform a writing and/or reading command on the memory chip in which the defective memory cell is found. Therefore, even when the time required to perform the post package repair operation is prolonged, the system connected to the memory device may operate normally without system interruption.

Figure 11:
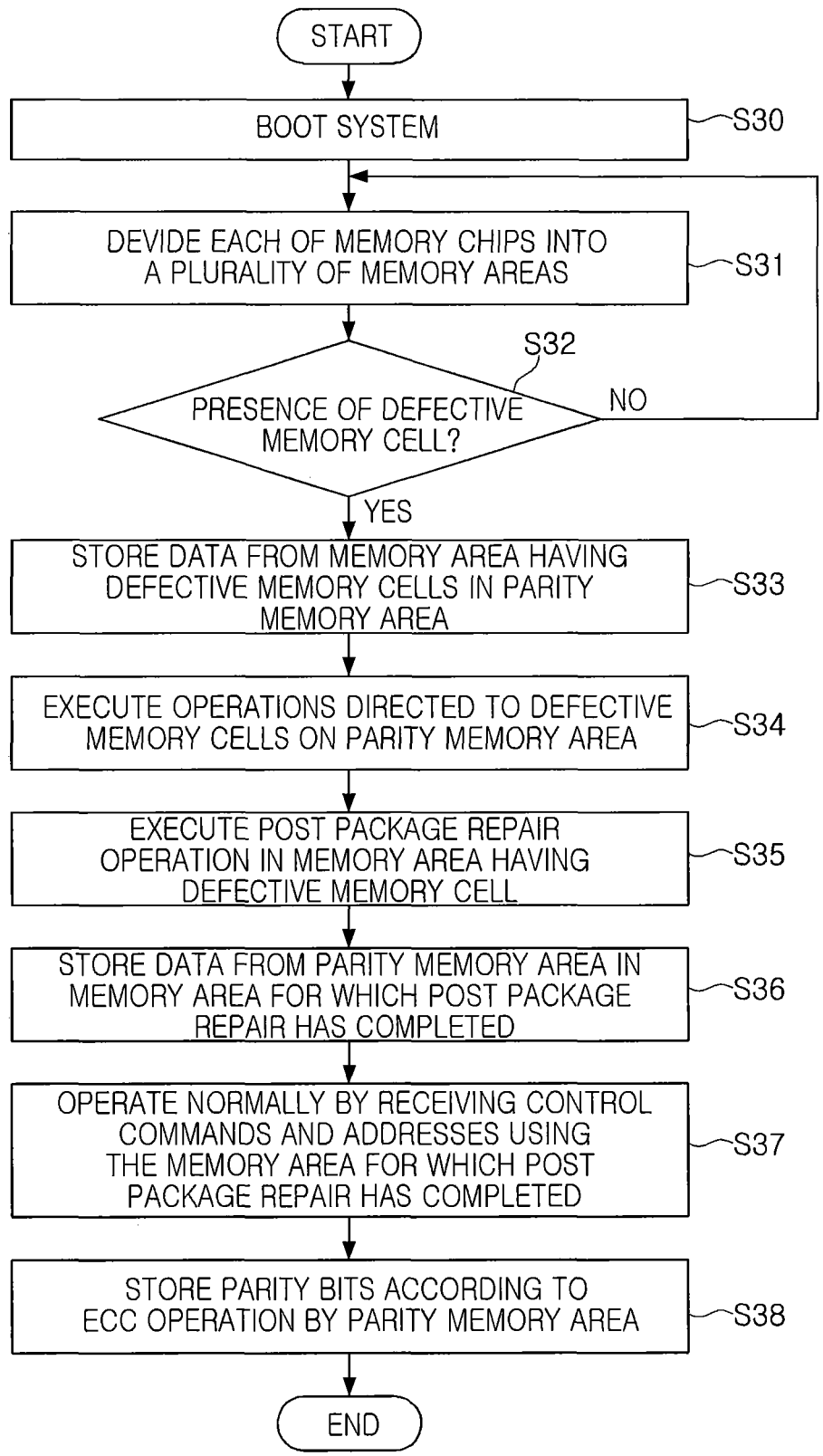
FIG. 11 is a flow chart provided to illustrate operations of the memory device according to example embodiments of the present inventive concept.

FIG. 11 is a flow chart provided to illustrate the operations of the memory device according to example embodiments of the present inventive concept. In example embodiments for the operations of the memory device described with respect to FIG. 11, each of the plurality of memory chips included in the memory device may be connected to different data input/output paths included in the memory device. The plurality of memory areas may be logically distinguished from each other.

Referring to FIG. 11, the operation of the memory device according to example embodiments of the present inventive concept may start by booting and operating the system on the memory device that is mounted, at S30. The system may include a computer, a server, a database, and/or a mobile device. An operating system OS installed in the system may be executed by booting the system in S30.

When a system is booted, the memory device may distinguish or partition each of the memory chips into a plurality of memory areas in S31. In some example embodiments, each of the memory chips included in the memory device may be distinguished or partitioned into 2N memory areas, where "N" is an integer. The number of memory areas logically separated in each of the memory chips may be equal to each other.

When a memory device is divided into a plurality of memory areas, each of the memory areas may be connected to different data input/output (DQ) paths. For example, when one memory device is connected to eight input/output (DQ) paths, the first to fourth input/output (DQ) paths may be connected to a first memory area and the fifth to eighth input/output (DQ) paths may be connected to a second memory area. For example, the first memory area and the second memory area may not share input/output (DQ) paths with each other. Therefore the memory device may control the first memory area and the second memory area as independent memory devices.

The memory device may determine whether a defective memory cell is present S32. When the presence of the defective memory cell is detected in S32, the memory device may store the data regarding the memory area having the defective memory cell in the parity memory area of the ECC memory chip in S33. The memory device may logically divide the ECC memory chip into a parity memory area and a CRC memory area, and data in a memory area having a defective memory cell may be transferred to the parity memory area.

The memory device controls the operations directed to the memory area having the defective memory cell to execute alternatively on the parity memory area in S34. The post-package repair is executed in the memory area having the defective memory cell in S35. As described above, the time required for the post package repair may violate the timeout specification specified by the operating system of the system. According to example embodiments illustrated with respect to FIG. 10, since the operation of the memory area having the defective memory cell is replaced by the parity memory area while the post package repair is in progress, the post package repair may be executed without system interruption. Additionally operations directed to the defective memory cell are redirected to the parity memory area, thus enabling normal operations of the system to continue without interruption.

When the post package repair is completed, the memory device stores the data from the parity memory area in the memory area in which the post package repair is completed, at S36. The memory device controls the memory area to receive the control command and the address command and operated normally in S37. Meanwhile, the memory device may set the parity memory area to provide the ECC function at S38. For example, the parity memory area may store parity bits according to ECC operation after the post package repair is completed.

FIGS. 12, 13A, 13B, 13C and 13D are diagrams provided to illustrate operations of the memory device according to example embodiments of the present inventive concept.

Figure 12:
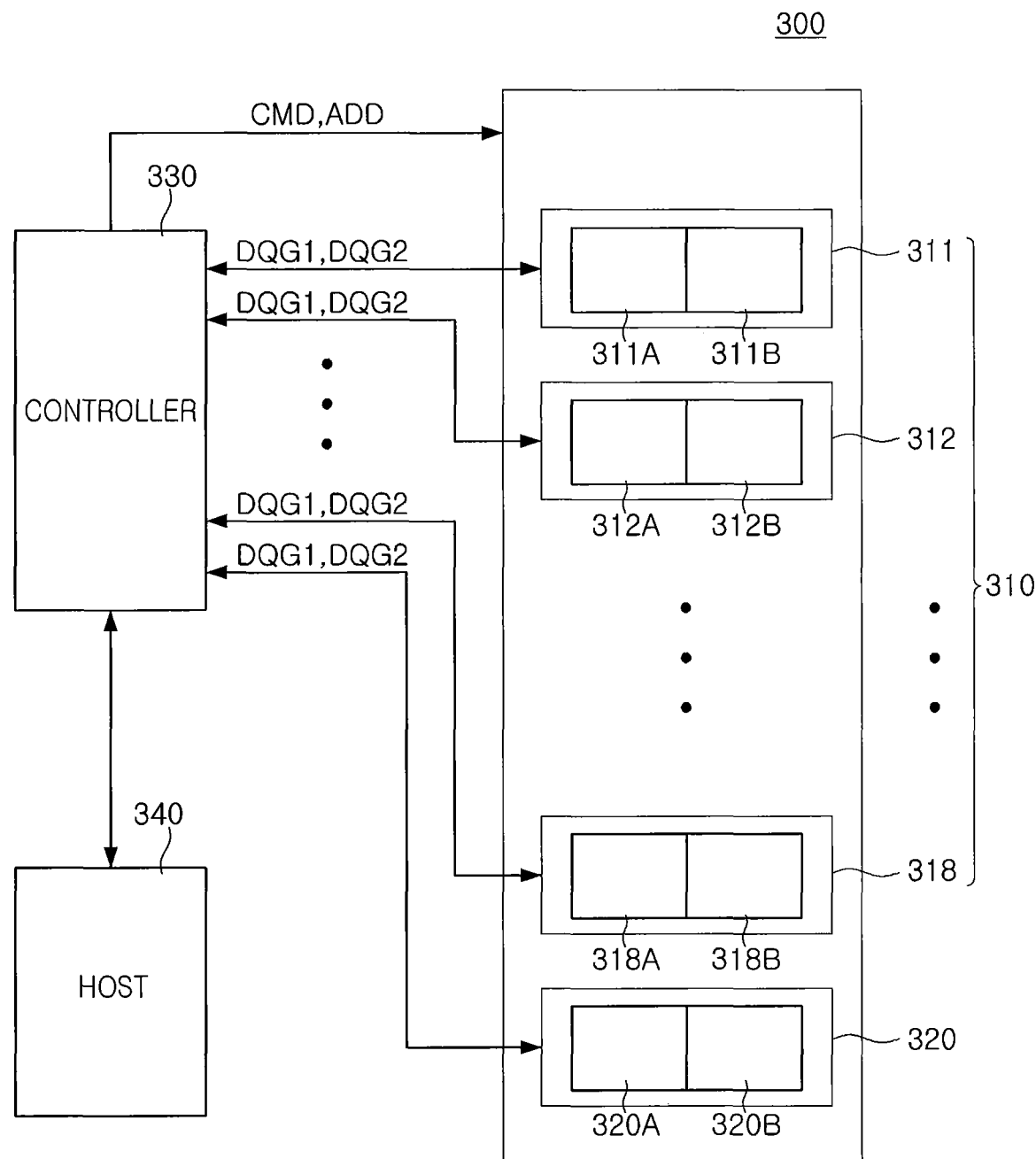
FIGS. 12, 13A, 13B, 13C and 13D are drawings provided to illustrate operations of the memory device according to example embodiments of the present inventive concept.

Referring to FIG. 12, a memory device 300 according to example embodiments of the present inventive concept may include a plurality of memory chips 311-318 that may be collectively referred to as memory chips 310, an ECC memory chip 320 and a controller 330. The controller 330 may control operations of the plurality of memory chips 310 and the ECC memory chip 320. The controller 330 may include a register clock driver, in example embodiments.

One or more of the memory chips 310 may store and/or output data, and the ECC memory chip 320 may verify errors in the data. Each of the plurality of memory chips 310 may include a plurality of memory areas 311A-318A, 311B-318B. In example embodiments illustrated in FIG. 12, it is assumed that each of the memory chips includes the first memory areas 311A-318A and the second memory areas 311B-318B. However, the present inventive concept is not limited thereto. Meanwhile, the ECC memory chip 320 may include a parity memory area 320A for storing parity bits of the data, and a CRC memory area 320B for storing CRC codes of the data.

The controller 330 transmits the control command CMD and the address command ADD to the plurality of memory chips 310 and the ECC memory chip 320 and may control the ECC memory chip 320 the plurality of memory chips 310. In addition, the controller 330 may store data in at least one of the plurality of memory chips 310 through the first and second data input/output path groups DQG1 and DQG2 or may read data from at least one of the plurality of memory chips 310. In example embodiments illustrated in FIG. 12, each of the first memory areas 311A-318A and the parity memory area 320A may be connected to the first data input/output path group DQG1, and each of the second memory areas 311B-318B and the CRC memory area 320B may be connected to the second data input/output path group DQG2. Accordingly, the first memory areas 311A-318A and the second memory areas 311B-318B may operate independently in each of the plurality of memory chips 310. And the parity memory area 320A and the CRC memory area 320B may also operate in the ECC memory chip 320 independently. Expressions such as "at least one of," when preceding a list of elements, modify the entire list of elements and do not modify the individual elements of the list.

As an example, when the memory device 300 has 64 GB of storage space, each of the plurality of memory chips 310 may have 8 GB of storage space, and the ECC memory chip 320 may also have 8 GB storage space. Each of the first memory areas 311A-318A and the second memory areas 311B-318B may have 4 GB of storage space, each of the parity memory area 320A and the CRC memory area 320B may also have 4 GB of storage space. The first and second data input/output path groups DQG1 and DQG2 may have the same number of data input/output paths. For example, when the memory device operates in the x8 mode, each of the groups DQG1 and DQG2 may include four data input/output paths.

When a defective memory cell occurs in at least one of the plurality of memory chips 310, the memory device 300 replaces the function of the memory area in which the defective memory cell occurs with the parity memory area 320A and a post package repair on the defective memory cell may be initiated. Thus, while the post package repair is in progress, the memory device 300 may be able to operate normally.

As one example, when the defective memory cell occurs in the second memory area 312B of the second memory chip 312, the controller 330 stores data stored in the second memory area 312B in the parity memory area 320A, and may replace the function of the second memory area 312B with the parity memory area 320A. The controller 330 may replace the function of the second memory area 312B with the parity memory area 320A by transmitting the function of a control command CMD and an address command ADD to the parity memory area 320A in lieu of the second memory area 312B that has been determined to be defective. Meanwhile, the controller 330 may control the second memory area 312B of the second memory chip 312 to execute the post package repair.

As described above, the first memory areas 311A-318A and the second memory areas 311B-318B included in each of the plurality of memory chips 310 may have the same or similar amount of storage space as the parity memory area 320A. Therefore, the parity memory area 320A may replace the function of the second memory area 312B of the second memory chip 312 and the memory device 300 may operate normally while the post package repair is executed in the second memory chip 312B. A host 340 may communicate with the controller 330 and provide interfaces to guide the operations of the controller 330. The host 340 may be an Application Processor (AP), a Central Processing Unit (CPU), a System-on-Chip (SoC), and etc.

Next, referring to FIGS. 13A to 13D, memory device 400 may include a plurality of memory chips 420 mounted on a substrate 410 and an ECC memory chip 430. Each of the plurality of memory chips 420 and the ECC memory chip 430 may be provided to one chip and may include the plurality of memory areas 412, 422 or memory areas 431, 432, respectively, connected to different data input/output (DQ) paths.

In some example embodiments, each of the plurality of memory chips 420 may include a first memory area 421 and a second memory area 422. In addition, the ECC memory chip 430 may include a parity memory area 431 and a CRC memory area 432. The first memory area 421 and the second memory area 422 may be areas logically separated from each of the plurality of memory chips 420 by the controller 440, and the parity memory area 431 and the CRC memory area are also may be areas logically separated by the controller 440.

Figure 13A:
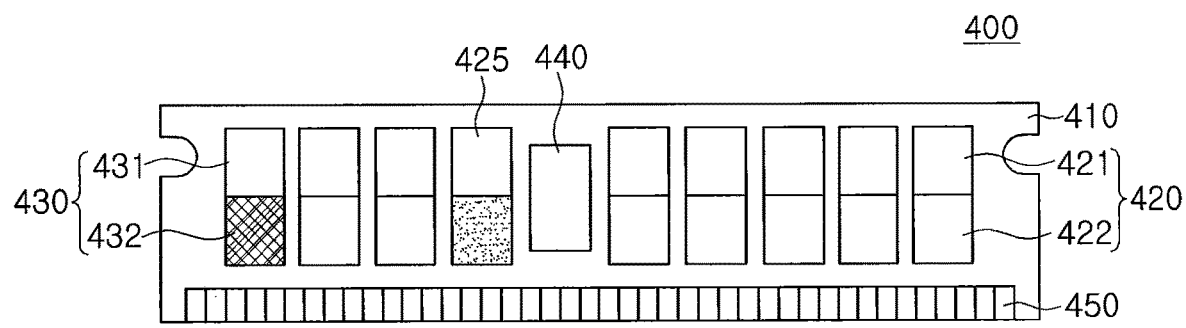
Figure 13B:
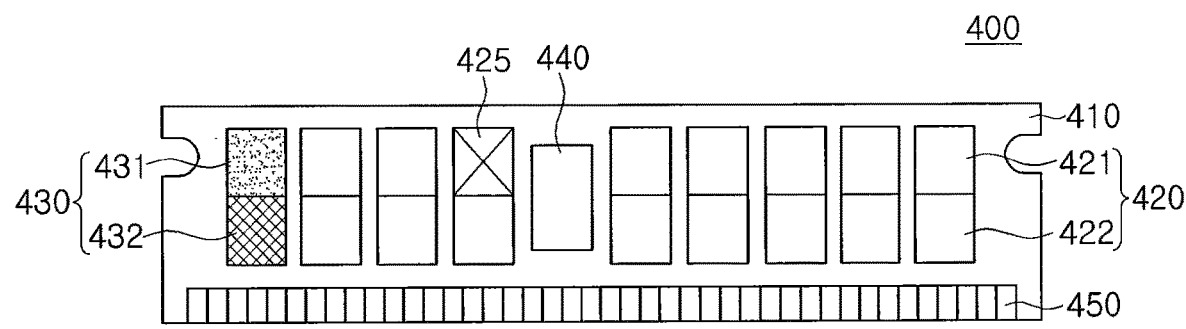

Referring to FIG. 13A, a defective memory cell may occur in at least one of the first memory area 421 and the second memory area 422 included in the plurality of memory chips 420. The controller 440 marks the memory area in which the defective memory cell occurred as the defective memory area 425 and the data stored in the defective memory area may be transferred and stored in the ECC memory chip 430. As an example, as illustrated in FIG. 13B, data stored in the defective memory area 425 may be stored in the parity memory area 431.

While the defective memory area 425 is marked as defective, the operations of the defective memory area 425 may be performed by the parity memory area 431. For example, in response to the data storage and/or output command, the parity memory area 431 may store or output the data instead of the defective memory area 425. The alternative control of the operations of a defective memory may be guided by the controller 440.

Figure 13C:
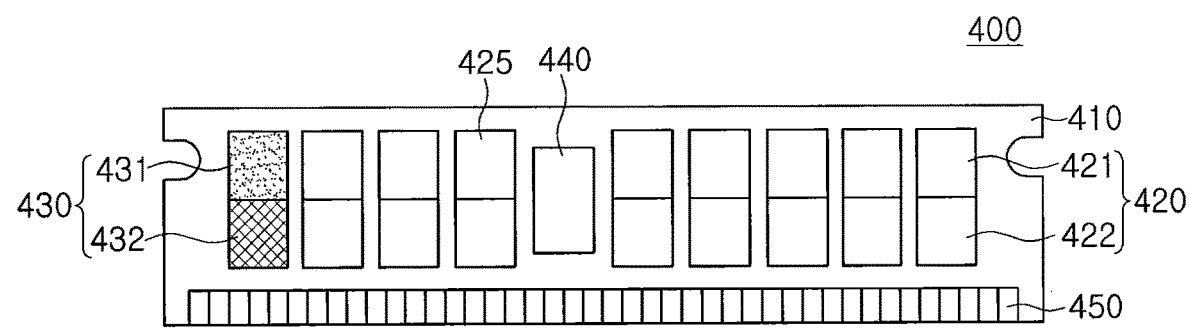

The memory device 400 may control the defective memory area 425 to execute the post package repair in response to a command from the controller 440 or an external host. In one example embodiment, post package repair may be performed by mapping the address of either the row line or the column line connected to the defective memory cell to any of a plurality of redundancy lines connected to the plurality of redundancy memory cells. Thus, in response to a data storage and/or output command for a defective memory cell, the redundancy memory cell may actually store and/or output data. When the post package repair is completed, the memory device 400 may remove the defective marking to defective memory area 425, as illustrated in FIG. 13C.

Figure 13D:
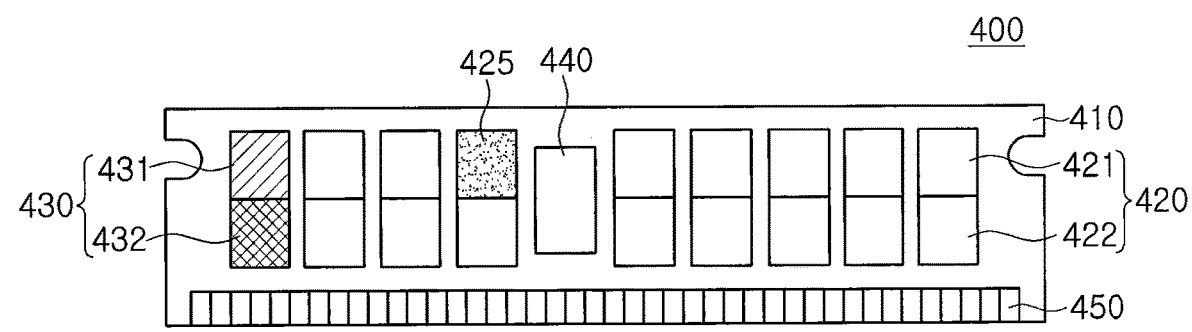

Referring to FIG. 13D, after removing the defective marking on the defective memory area 425, the memory device 400 may transfer and store the data stored in the parity memory area 431 to the memory area 425 in which the defective marking is removed. In addition, the memory device 400 may control the parity memory area 431 to perform the function of storing the parity bits once again. In other words, parity functions may be temporarily suspended when the parity memory area 431 is repurposed to store data originally intended for the defective memory area 425.

According to example embodiments illustrated in FIGS. 13A to 13D, a post-package repair for repairing a defective memory cell without system interruption may be executed in the memory device 400 even while the system on which the memory device 400 is mounted is booted and operated. Particularly, while the post-package repair is executed in the defective memory area 425, the memory device 400 may operate normally since the parity memory area 431 performs the functions of the defective memory area 425. In addition, after the post package repair is completed, the defect rate of the memory device 400 may be lowered and the operation performance and stability may be improved since the ECC memory chip may provide the ECC function again.

Figure 14:
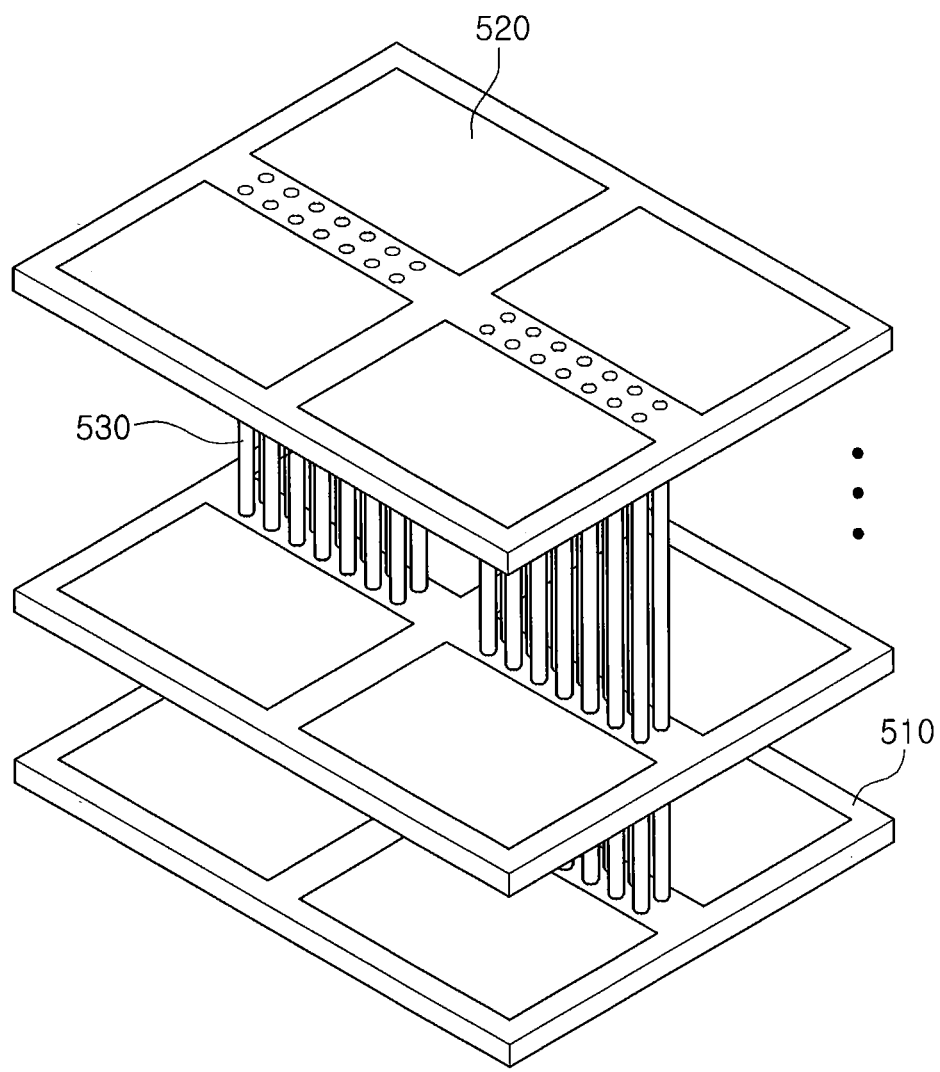
FIG. 14 is a schematic diagram of a stacked memory package according to example embodiments of the present inventive concept.

FIG. 14 is a schematic drawing of a stacked memory package according to example embodiments of the present inventive concept.

Referring to FIG. 14, the stacked memory package 500, according to example embodiments of the present inventive concept, may include a plurality of memory chips 510 stacked vertically in the stacked memory package 500. The plurality of memory chips 510 may include a plurality of memory banks 520 and be connected by one or more Through Silicon Vias (TSV) 530.

Each of the plurality of memory chips 510 may be implemented according to various example embodiments described above with reference to FIGS. 1 to 13. For example, when a defective memory cell occurs in at least one of the plurality of memory banks 520 included in each of the plurality of memory chips 510, the data regarding the memory chip in which the defective memory cell occurs is transferred to the ECC memory chip. A post-package repair may be executed on the memory chip in which the defective memory cell occurs. When the post package repair is completed, the data stored in the ECC memory chip may be transferred to the memory chip in which the post package repair is completed. Therefore, even when the system on which the stacked memory package is mounted is booted and operated, the defective memory cell may be repaired via post package repair without system interruption, thereby improving the stability of the system.

Figure 15:
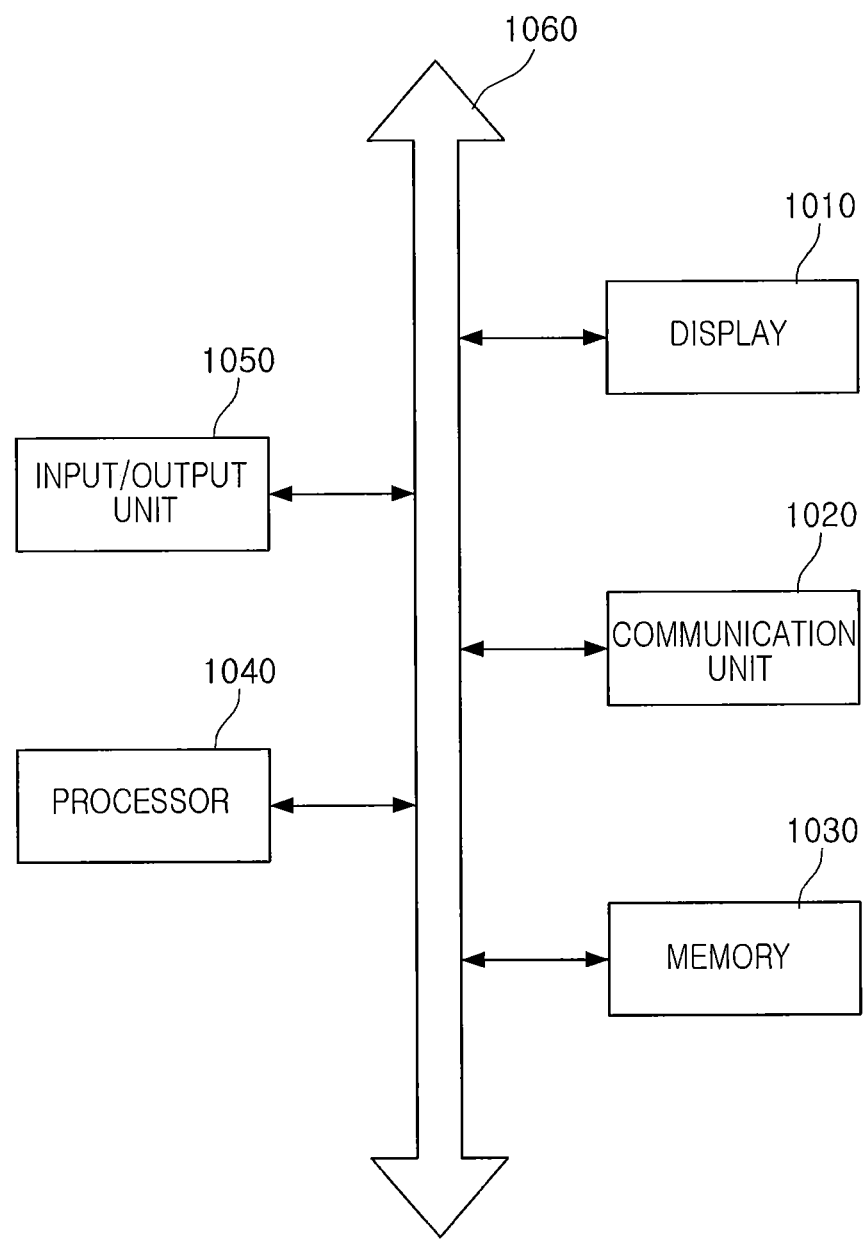
FIG. 15 is a schematic block diagram of an electronic device including the memory device according to example embodiments of the present inventive concept.

FIG. 15 is a schematic block diagram of an electronic device including the memory device according to example embodiments of the present inventive concept.

An electronic device 1000 according to example embodiment illustrated in FIG. 15 may include a display 1010, a communication unit 1020, a memory 1030, a processor 1400 and an input/output unit 1050. Components such as the display 1010, the communication unit 1020, the memory 1030, the processor 1040 and/or the input/output unit 1050 may communicate with each other via a bus 1060. In addition to the illustrated components, the electronic device 1000 may further include a power supply, one or more ports and the like.

A processor 1040 may perform specific operations, commands, tasks, and so on. The processor 1040 may be a central processing unit CPU, a microprocessor unit MCU, an application processor AP and so on, and may communicate with other components such as the display 1010, the communication unit 1020, the memory 1030 and an input/output unit 1050 through the bus 1060.

The memory 1030 included in the electronic device 1000 illustrated in FIG. 15 may include a memory device according to example embodiments of the present inventive concept. As one example, the memory 1030 may operate according to various example embodiments described with reference to FIGS. 1-14. The memory 1030 may store, output or delete data in response to a command transmitted from the processor 1040. Also, the memory 1030 may execute a post package repair in the memory device in which the defective memory cell occurs, in response to a command transmitted from the processor 1040, while the electronic device 1000 is booted and operating.

The present inventive concept is not limited to the above described example embodiments and accompanying drawings but is intended to be limited by the appended claims. Therefore, various kinds of the substitutions, modifications and changes by the person of ordinary skill in the pertinent art within the scope of the technical idea described in the appended claims of the present inventive concept may be possible. And this is also cover the scope of the present inventive concept.

As set forth above, according to example embodiments of the present inventive concept, a memory chip included in a memory device may execute a post package repair operation on a defective memory cell, even while the system on which the memory device is mounted is booted and operated. Therefore, the defect rate of the memory device may be significantly reduced, and a problem in which the system goes down may be prevented while the memory chip executes the post package repair operation.

While example embodiments have been shown and described above, it will be apparent to those skilled in the art that modifications and variations could be made without departing from the scope of the present inventive concept as defined by the appended claims.

What is claimed is:

1. A memory device comprising:
 a plurality of memory chips, ones of the plurality of memory chips comprising a plurality of memory cells connected to a plurality of row lines and a plurality of column lines, and a plurality of redundancy memory cells connected to a plurality of redundancy lines; and
 an error check and correction (ECC) memory chip configured to store at least one of parity data and cyclic redundancy check (CRC) codes of data stored and/or output by the plurality of memory chips,
 wherein data stored in a defective memory chip comprising a defective memory cell among the plurality of memory chips are moved to the ECC memory chip, and
 wherein an address of a defective row line connected to the defective memory cell is replaced with an address of a first redundancy line among the plurality of redundancy lines.

2. The memory device of claim 1,
 wherein a first operation on memory cells connected to the defective row line is replaced with a second operation on first redundancy memory cells of the plurality of redundancy memory cells connected to the first redundancy line, and
 wherein the first operation corresponds to the second operation.

3. The memory device of claim 2, wherein the ECC memory chip performs a third operation, different from the first operation and the second operation, on the defective memory chip, while an address of the defective row line is programmed and replaced with the address of the first redundancy line.

4. The memory device of claim 1, wherein the defective memory chip is configured to replace the defective memory cell and a plurality of target memory cells sharing a row line with the defective memory cell, with the plurality of redundancy memory cells.

5. The memory device of claim 1,
 wherein a defective marking associated with the defective memory chip is removed.

6. The memory device of claim 1, wherein the ECC memory chip comprises a parity memory chip storing parity bits of the parity data and a CRC memory chip storing the CRC codes of the data.

7. A memory device, comprising:
 a plurality of memory chips;
 an ECC memory chip configured to store parity information and CRC codes associated with data stored by at least one of the plurality of memory chips; and a controller configured to move data of a defective memory cell to the ECC memory chip, and configured to replace an address of a defective row line connected to the defective memory cell with an address of a first redundancy line among a plurality of redundancy lines, when a defective memory chip comprising the defective memory cell is detected among the plurality of memory chips.

8. The memory device of claim 7,
wherein each of the plurality of memory chips comprises a plurality of memory cells and a plurality of redundancy memory cells, and
wherein the defective memory chip is configured to replace the defective memory cell and a plurality of target memory cells sharing a row line with the defective memory cell, with the plurality of redundancy memory cells.

9. The memory device of claim 7,
wherein the ECC memory chip comprises a parity memory chip storing parity bits of the data and a CRC memory chip storing CRC codes of the data.

* * * * *